US005450041A

United States Patent [19]

Halladay et al.

[11] Patent Number: 5,450,041

[45] Date of Patent: Sep. 12, 1995

[54] QUASI-OPTICAL OSCILLATOR USING RING-RESONATOR FEEDBACK

[75] Inventors: Ralph H. Halladay; George A. Emmons, both of Huntsville, Ala.

[73] Assignee: The United States of America as represented by the Secretary of the Army, Washington, D.C.

[21] Appl. No.: 308,334

[22] Filed: Sep. 19, 1994

[51] Int. Cl.[6] ............ H03B 5/02

[52] U.S. Cl. ............ 331/96; 331/107 DP; 331/107 P; 372/94

[58] Field of Search ............ 331/96, 107 DP, 107 P, 331/117 D; 372/92, 94

[56] References Cited

U.S. PATENT DOCUMENTS 4,496,913 1/1985 Wandinger et al. ......... 331/107 DP 4,666,302 5/1987 Rodloff et al. ............ 372/94

4,926,094 5/1990 Bondeson et al. ............ 372/2

*Primary Examiner*—Siegfried H. Grimm

*Attorney, Agent, or Firm*—Anthony T. Lane; Hugh P. Nicholson; Hay Kyung Chang

[57] ABSTRACT

A high-power oscillator which uses a quasi-optical ring resonator to provide the feedback required for oscillation allows energy to travel in one direction only within the resonator and suffers little loss of energy during operation. The oscillator is built by inserting an array of amplifiers, tuned to a desired frequency, into the quasi-optical ring resonator formed by three reflective mirrors. The mirrors are spaced such that the total loop phase shift is equal to an integer multiple of 360 degrees at the desired frequency and, by proper selection of the amplifiers, the loop gain is set to be greater than or equal to one.

4 Claims, 3 Drawing Sheets

QUASI-OPTICAL OSCILLATOR USING RING-RESONATOR FEEDBACK

DEDICATORY CLAUSE

The invention described herein may be manufactured, used and licensed by or for the Government for governmental purposes without the payment to us of any royalties thereon.

BACKGROUND OF THE INVENTION

Quasi-optics denotes an extension of optical techniques to microwave and millimeter-wave frequencies. A promising application of quasi-optics is in the area of millimeter-wave power generation by combining the radio-frequency (RF) power of an array of several solid-state oscillators or amplifiers. Some demonstrated quasi-optic combination techniques are explained with reference to the figures wherein like numbers refer to like parts. One such technique is "space feeding and combination of amplifiers." In this method, as illustrated in FIG. 1, the input signal is fed to an array 105 of amplifiers 111, 113, 115 through open space using radiating antenna 101 and collimating lens 103 which provide an equal phase front to the amplifier array. After the reception, amplification and reradiation of the signal by the array, the energy is recaptured by focusing lens 107 and receiving antenna 109 and routed to the load (not shown here). The amplifiers may be on a planar substrate or in a waveguide structure. Further, it may be necessary to cascade several arrays of these amplifiers to provide enough driver power to saturate the final amplifier array for maximum output power.

Another demonstrated quasi-optic combination technique is practiced in an open Fabry-Perot resonator. This technique consists of coupling the output energy from an oscillator array 203 into the fundamental beam wave of Fabry-Perot resonator 201. The resonator consists of 100% reflective mirror 205 and partially reflective mirror 207 through which energy is coupled out. In operation, energy output from oscillator array 203 is incident on partially reflective mirror 207 which reflects a portion of the output and transmits it back to the oscillator array as feed-back signal. This requires the length of the cavity to be such that the incident energy and reflected energy is in phase. As is illustrated by the double-headed arrows in FIG. 2, oscillator output and the feedback signals share the same quasi-optical paths. This combining technique relies on the unobstructed reflections from the two mirrors, with the continuously reflecting energy being pumped by the individual oscillators. However, the bias leads, matching circuits and the substrate cause loss and secondary reflections which reduce the cavity Quality factor (Q) and are liable to create undesired interference.

As can be seen from comparing the two techniques described above, oscillator architecture differs from amplifier architecture in that a part of the output signal from the active devices (oscillators, in this case) is fed back to them as input through a feedback loop and is in turn amplified. The feedback conditions for oscillation are: (1) the magnitude of the open loop insertion gain must be greater than 1 (this is achieved by a selection of the amplifiers to be used) and (2) the phase of the open loop insertion gain must be an integer times 360 degrees. When these conditions are met, the signal grows in amplitude with each cycle until the active devices saturate and the steady state oscillation is achieved.

SUMMARY OF INVENTION

A high-power quasi-optical oscillator uses a ring-resonator to provide the feedback that is required for oscillation. The oscillator is built by inserting an array of amplifiers into the ring-resonator, the amplifiers being chosen to produce the output power of desired frequency, such as microwave or millimeter-wave frequencies. The ring-resonator is formed by two totally reflective mirrors and one partially transmissive/partially reflective mirror, each mirror occupying a vertex of an isoscles triangle. The partially transmissive/partially reflective mirror is used to transmit therethrough a portion of the resonator energy as oscillator output power. The mirrors are arranged such that the sum of the total physical length around the ring, the phase shift at each mirror and the phase shift through the amplifier array creates a loop phase shift of an integer multiple of 360 degrees at the desired frequency. In this geometry, the energy that is reflected by the mirrors travels in only one direction within the resonator. This condition, along with amplifier gain being greater than the feedback path loss, ensures the achievement of positive feedback that is necessary for steady-state oscillations at microwave or millimeter wave frequencies.

DESCRIPTION OF PREFERRED EMBODIMENT

Millimeter-wave radars and seekers offer the potential for all weather operations for tactical weapon systems in both land combat and air defense roles. Realization of this potential, however, requires high power millimeter-wave sources to serve as transmitters. Quasi-optical power combining offers a means for achieving high power with solid-state sources in small packages. Quasi-optical oscillator using ring-resonator feedback provides a means for implementing the resonator feedback that is required in quasi-optical millimeter-wave oscillator construction.

In order to combine the outputs of many individual oscillators, there must be a mechanism for ensuring that the oscillators run in-phase so that the power contribution from each oscillator will be additive. Quasi-optic resonators provide a convenient means of obtaining such in-phase oscillations due to the fact that equal phase feedback is applied to the entire array of amplifiers within the resonator. Each resonator achieves oscillation when ambient noise becomes amplified by the amplifiers (selected to produce output of a given frequency), fed back and re-amplified, this process continuing until the resonator saturates and the steady-state coherent oscillation occurs.

Figure 1:
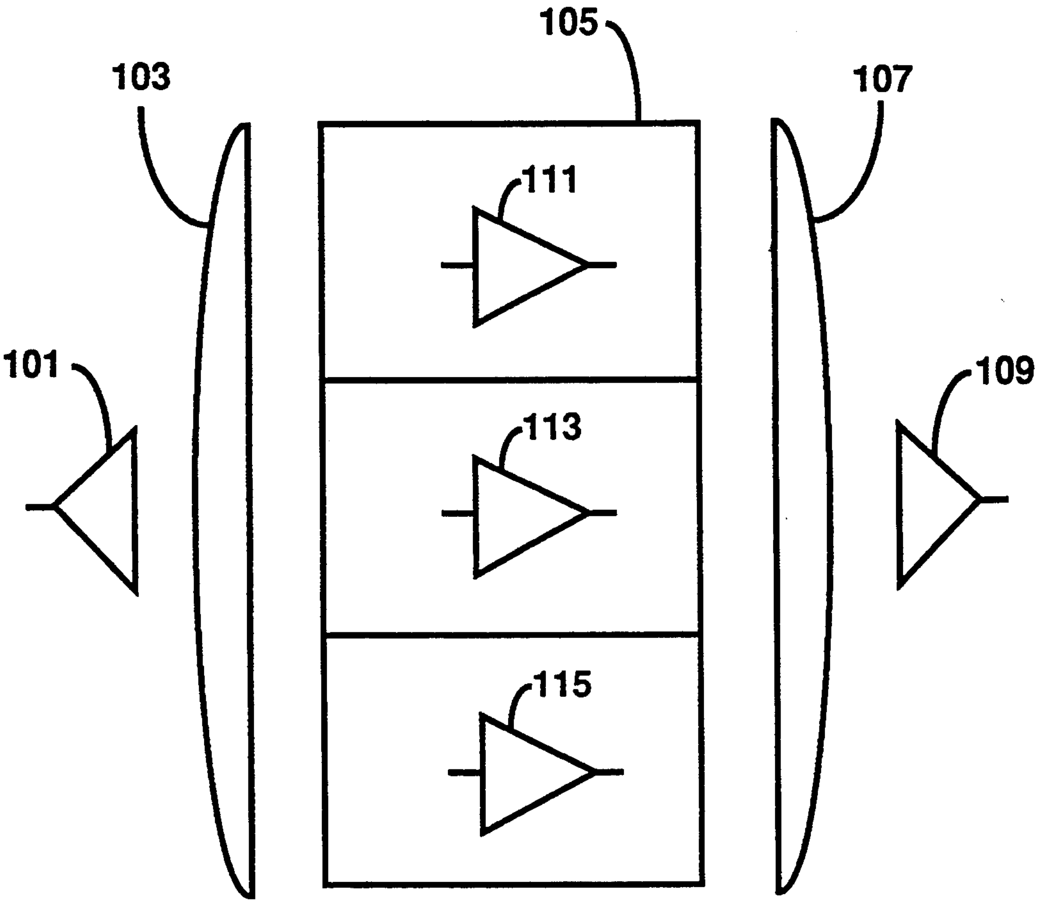
PRIOR ART FIG. 1
FIG. 1 illustrates quasi-optical combining in space.
Figure 2:
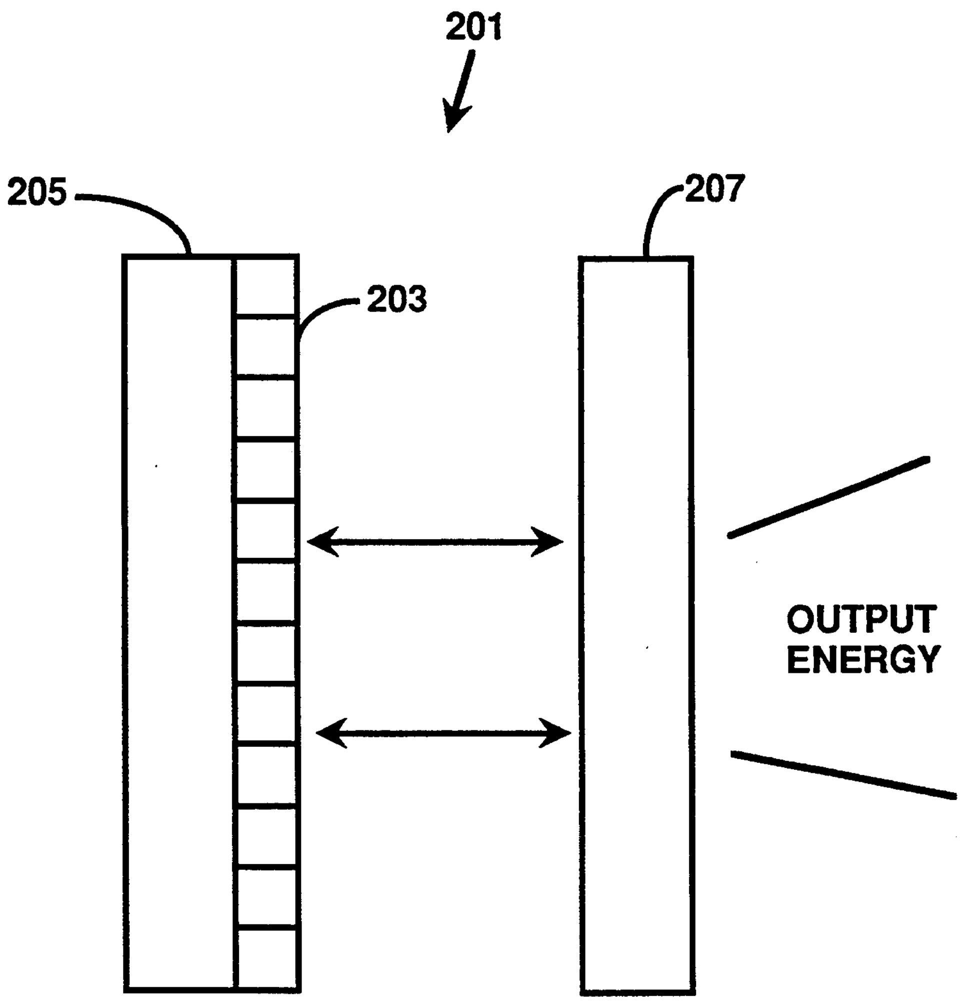
PRIOR ART FIG. 2
FIG. 2 illustrates quasi-optical combining in a Fabry-Perot resonator.
Figure 3:
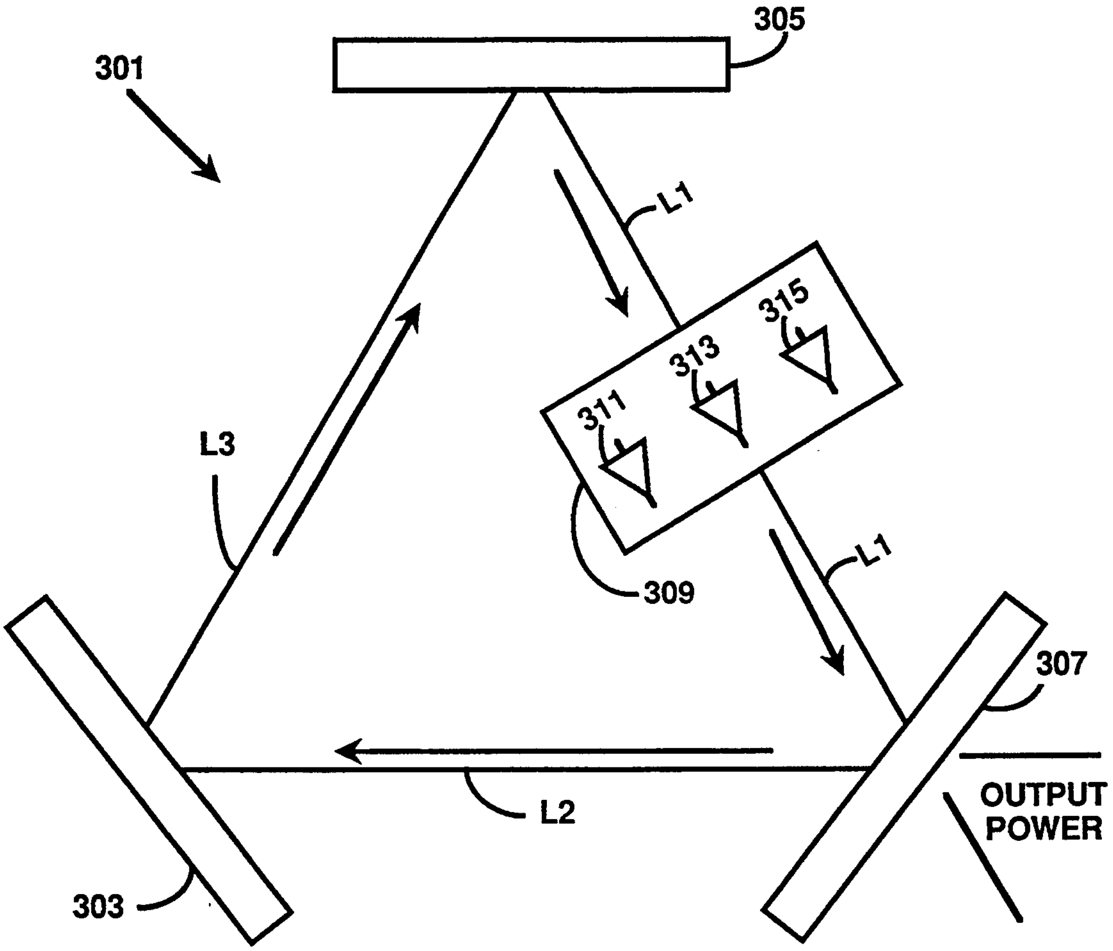
FIG. 3 is a diagram illustrating the preferred embodiment of the quasi-optical oscillator using ring-resonator feedback.

Quasi-optical oscillator using ring-resonator feedback, as illustrated in FIG. 3, provides for the feedback a separate quasi-optical path that is not shared by another beam going in an opposite direction. This structure allows for less resonator loss, thereby resulting in extremely stable operation since the oscillation stability is a function of resonator losses.

In operation, quasi-optical oscillator using ring-resonator feedback, 301, functions as follows: non-coherent ambient noise becomes amplified by array 309 of two-part amplifiers 311, 313, 315 and is incident on partially reflective/partially transmissive mirror 307. (The number of amplifiers shown in the figure is for illustrative purposes only and can be greater). A portion of the amplified energy is then reflected by mirror 307, and is fed back as input to mirror 303 to be further reflected thereby. Mirror 303, in turn, reflects the energy to mirror 305 which reflects it even further to mirror 307. On route to mirror 307 from mirror 305 the energy is intercepted and amplified by the array of amplifiers. This process is repeated around the ring formed by the mirrors, the energy traveling only in one direction within the resonator, as indicated by the arrows, until the ring resonator saturates and steady-state coherent oscillation is reached. Energy reflects from one mirror to the next continuously as described above due to the ring shape. The ring traces out an isosceles triangle with the mirrors being positioned each at a vertex such that their perpendicular bisectors are midway between the sides of the triangle. Even though FIG. 3 shows the array of amplifiers to be between mirror 305 and mirror 307, the exact location of the array within the ring parameter is irrelevant as long as the amplifiers are suitably positioned to intercept and amplify the energy while it travels between the mirrors. However, the amplifiers must be suitable for producing output energy at the desired frequency. Millimeter wave amplifiers, the best choice for the operation of quasi-optical oscillator using ring-resonator feedback, are available from many sources, such as Millitech Corp., Watkins-Johnson, TRW and Hughes. Along with the amplifiers being chosen to have the maximum gain at a particular frequency, the mirrors are positioned so that the total phase shift around the ring equals an integer multiple, N, of 360 degrees at the desired output frequency. The total phase shift equals the sum of L1, L2, L3, the phase shift at each mirror and the phase shift through the amplifier array. These conditions cause the oscillations to build up initially from non-coherent noise and to be amplified in each cycle around the ring until the resonator saturates and steady-state oscillation occurs. Mirror 307 is partially transmissive to transmit therethrough a portion of the amplified energy of the oscillator as output power.

The above-described architecture of quasi-optical oscillator has several advantages over the conventional power combining circuitry such as hybrid junctions and couplers. Some of them are: extremely stable operation due to very low resonator loss, construction in a transmissive fashion and cascading capability. The low loss is possible because the energy does not have to leak past a lossy dielectric substrate to the reflecting mirror as it must in the Fabry-Perot resonator. The transmissive construction, as opposed to a reflective grid array, allows the amplifiers to be constructed in waveguide or other media that have propagation advantages and cascading capability. The transmissive construction is possible because the amplifier array is not required to be planar and allows improvements in the loop gain or to add sufficient impedance matching circuits to achieve optimum output impedances for maximum power.

Although a particular embodiment and form of this invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

We claim:

1. A Quasi-optical oscillator using ring-resonator feedback, said oscillator comprising: a plurality of mirrors arranged in a loop such that quasi-optical beam wave is reflected thereby in one direction within the loop and an amplifying means, said means being positioned within the loop to intercept and amplify the quasi-optical beam wave prior to transmitting the wave to be further reflected by one of said mirrors.

2. An oscillator as set forth in claim 1, wherein each of said mirrors occupies a vertex of an isosceles triangle.

3. An oscillator as set forth in claim 2, wherein said amplifying means comprises an array of two-part amplifiers.

4. An oscillator as set forth in claim 3, wherein one of said mirrors is partially transmissive to allow therethrough a portion of the output of said oscillator.

* * * * *